(12) United States Patent
Hsu et al.

(10) Patent No.: US 9,117,830 B2
(45) Date of Patent: Aug. 25, 2015

(54) SEMICONDUCTOR STRUCTURE FOR EXTREME ULTRAVIOLET ELECTROSTATIC CHUCK WITH REDUCED CLAMPING EFFECT

(71) Applicant: Taiwan Semiconductor Manufacturing Company, Ltd., Hsin-Chu (TW)

(72) Inventors: Chia-Hao Hsu, Hsinchu (TW); Chia-Chen Chen, Hsinchu (TW); Tzung-Chi Fu, Miaoli (TW); Tzu-Wei Kao, Hsinchu (TW); Yu Chao Lin, Hsinchu (TW)

(73) Assignee: Taiwan Semiconductor Manuacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 14/296,519

(22) Filed: Jun. 5, 2014

(65) Prior Publication Data

US 2014/0284604 A1 Sep. 25, 2014

Related U.S. Application Data

(62) Division of application No. 13/602,618, filed on Sep. 4, 2012, now Pat. No. 8,765,582.

(51) Int. Cl.
*H01L 23/00* (2006.01)
*H01L 29/06* (2006.01)
*H01L 29/34* (2006.01)
*H01L 21/3215* (2006.01)
*G03F 7/20* (2006.01)
*H01L 21/265* (2006.01)
*H01L 21/683* (2006.01)

(52) U.S. Cl.
CPC .......... *H01L 23/562* (2013.01); *G03F 7/70708* (2013.01); *H01L 21/32155* (2013.01); *H01L 29/0603* (2013.01); *H01L 29/34* (2013.01); *H01L 21/26506* (2013.01); *H01L 21/6831* (2013.01)

(58) Field of Classification Search
CPC ... H01L 23/562; H01L 29/34; H01L 29/0603; H01L 21/32155; H01L 21/26506; H01L 21/6831; G03F 7/00; G03F 7/70708
USPC ................................................. 257/49, 64, 67
See application file for complete search history.

(56) References Cited

U.S. PATENT DOCUMENTS

| | | | |
|---|---|---|---|
| 4,400,715 A * | 8/1983 | Barbee et al. ................... | 257/74 |
| 5,587,696 A | 12/1996 | Su et al. | |
| 5,605,602 A | 2/1997 | DeBusk | |
| 5,793,155 A | 8/1998 | Vasche | |

(Continued)

OTHER PUBLICATIONS

Stinson et al., "Ion Implantation Iduced Effects At Polysilicon Gate Feature Edges", 1989, MRS Symp. Proc. vol. 157, pp. 733-738. Dec. 1989.

(Continued)

*Primary Examiner* — Nikolay Yushin
(74) *Attorney, Agent, or Firm* — Haynes and Boone, LLP

(57) ABSTRACT

The present disclosure provides one embodiment of a semiconductor structure. The semiconductor structure includes a semiconductor substrate having a front surface and a backside surface; integrated circuit features formed on the front surface of the semiconductor substrate; and a polycrystalline silicon layer disposed on the backside surface of the semiconductor substrate.

20 Claims, 6 Drawing Sheets

(56) References Cited

U.S. PATENT DOCUMENTS

| | | | |
|---|---|---|---|
| 6,040,592 A * | 3/2000 | McDaniel et al. | 257/292 |
| 2002/0192852 A1* | 12/2002 | Scharf et al. | 438/52 |
| 2003/0045131 A1 | 3/2003 | Verbeke et al. | |
| 2003/0211399 A1 | 11/2003 | Chang | |
| 2007/0077704 A1 | 4/2007 | Nieh | |
| 2007/0197036 A1 | 8/2007 | Miura et al. | |
| 2008/0113464 A1 | 5/2008 | Savransky | |
| 2009/0101977 A1 | 4/2009 | Iwamatsu et al. | |
| 2009/0302398 A1 | 12/2009 | Sell et al. | |
| 2009/0317962 A1 | 12/2009 | Noda | |
| 2010/0227461 A1 | 9/2010 | Ochi | |
| 2012/0146024 A1 | 6/2012 | Lysacek et al. | |
| 2013/0247935 A1 | 9/2013 | Park | |
| 2014/0061655 A1 | 3/2014 | Hsu | |

OTHER PUBLICATIONS

Kovalevskii A A et al: "Doping Effect on the Structure of Polycrystalline Silicon Films Grown via Silane Pyrolysis", Inorganic Materials, Dec. 1, 2005, pp. 1260-1265, vol. 41 No. 12, Pleiades Publishing, Inc., Minsk, Belarus.

International Search Report/Written Opinion issued in Netherlands Patent Application No. NL2010419 filed Mar. 11, 2013.

* cited by examiner

SEMICONDUCTOR STRUCTURE FOR EXTREME ULTRAVIOLET ELECTROSTATIC CHUCK WITH REDUCED CLAMPING EFFECT

RELATED APPLICATION

This is a divisional of U.S. application Ser. No. 13/602,618, which was filed on Sep. 4, 2012, the entire disclosure of which is incorporated herein by reference.

BACKGROUND

The semiconductor Integrated Circuit (IC) industry has experienced rapid growth. Technological advances in IC materials and design have produced generations of ICs where each generation has smaller feature size and more complex circuits than the previous generation. However, these advances have increased the complexity of processing and manufacturing ICs and, for these advances to be realized, similar developments in IC processing and manufacturing are needed.

Integrated circuits are typically formed onto a semiconductor wafer. Various photolithographic processes are used to form the individual components that make up the integrated circuit into the wafer. Such components include transistors, diodes, capacitors, resistors, and various interconnect features and isolation features. When the feature sizes are smaller in the advanced technologies, it is expected that the photolithography system has high resolution and accordingly short radiation wavelength. One type of photolithographic system used to form such components is an Extreme Ultra-Violet (EUV) lithographic system. An EUV lithographic system involves projecting electromagnetic radiation having a wavelength between 10 nanometers (nm) and 120 nm onto the wafer. At such a small wavelength, the electromagnetic radiation is absorbed by air and thus the process has to be performed in a vacuum to avoid such absorption.

When performing an EUV lithography process, a chuck is used to secure a wafer within a vacuum chamber for the duration of the process. One example of a type of chuck is an electrostatic chuck (E-chuck). An E-chuck includes a charged plate that uses static electrical forces to secure the semiconductor wafer to the chuck. For example, a particular portion of the wafer may be positively charged. The corresponding plate on the E-chuck is then negatively charged. These opposite charges provide an attractive force that securely holds the wafer in place during the EUV process. In some cases, the stress from the static electrical force on the wafer may cause irregularities within the wafer. To relieve the force placed on the wafer, a gas is pumped through the E-chuck to the backside of the wafer. This gas is pressurized to provide an opposing force to the static electrical force. However, the current method and the wafer structure cannot effectively reduce the pressure on the wafer. Especially, the pressure is not uniformly distributed on the wafer surface and the stress is built up.

Therefore, there is a need for a structure for a wafer and methods of making and utilizing the same to address these concerns.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

DETAILED DESCRIPTION

Figure 1:
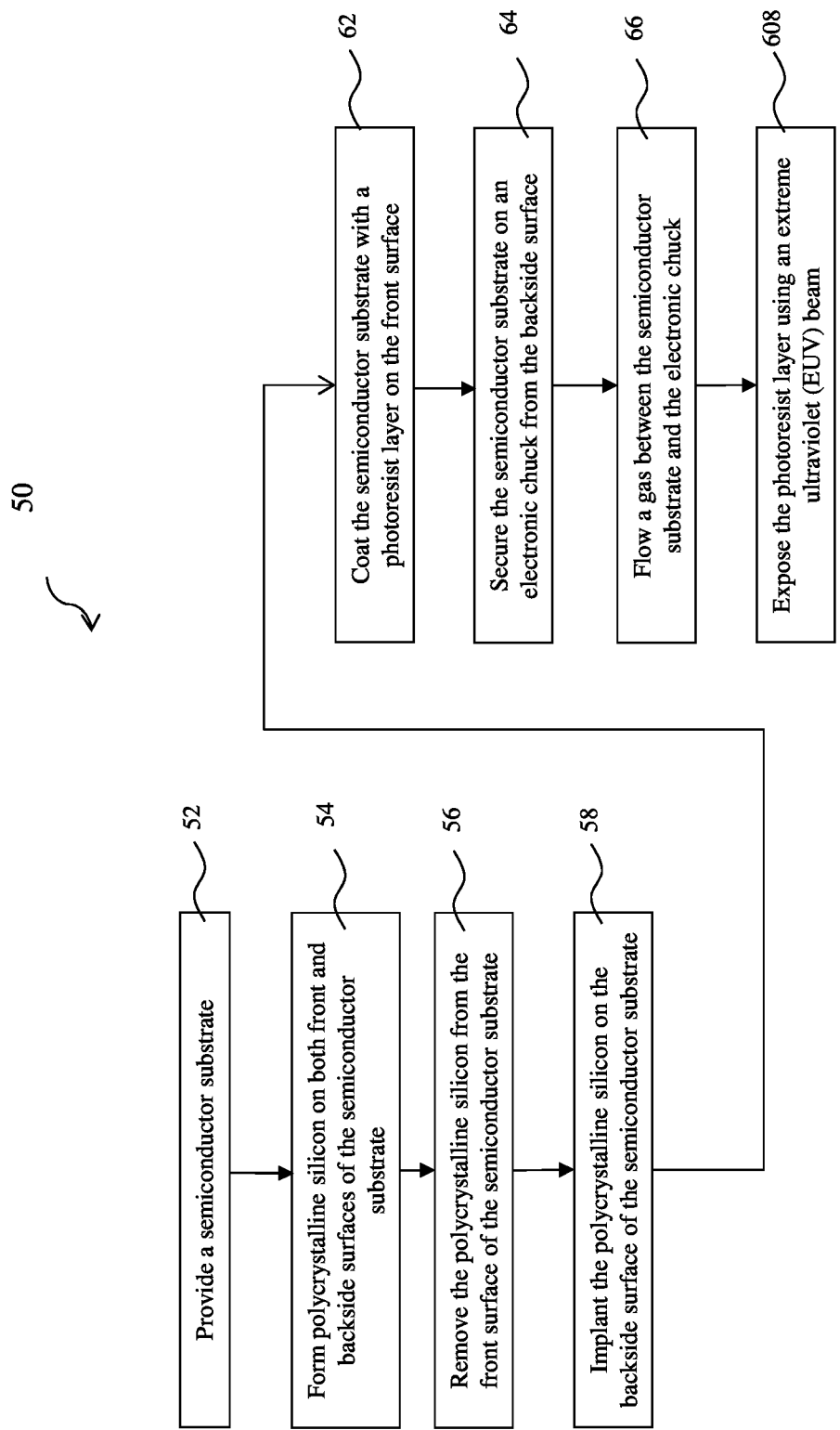
FIG. 1 is a flowchart illustrating a method for making an integrated circuit, constructed according to various aspects of the present disclosure in one or more embodiments.

It is to be understood that the following disclosure provides many different embodiments, or examples, for implementing different features of various embodiments. Specific examples of components and arrangements are described below to simplify the present disclosure. These are, of course, merely examples and are not intended to be limiting. In addition, the present disclosure may repeat reference numerals and/or letters in the various examples. This repetition is for the purpose of simplicity and clarity and does not in itself dictate a relationship between the various embodiments and/or configurations discussed. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact.

The present disclosure provides a structure and method to reduce the clamping effect of a semiconductor wafer during a lithography EUV exposure process by enhancing the surface roughness of the semiconductor wafer. In some embodiments, a polycrystalline silicon layer is formed on the backside of the wafer to increase the surface roughness.

FIG. 1 is a flowchart illustrating one embodiment of a method 50 for making an integrated circuit. FIGS. 2 through 5 are sectional views of a semiconductor substrate 80 constructed according to one or more embodiments. FIG. 6 is a schematic view of an integrated circuit fabrication system 100, in portion, constructed according to one embodiment. The method 50 and the semiconductor wafer 80 are collectively described with reference to FIGS. 1 through 6.

Figure 2:
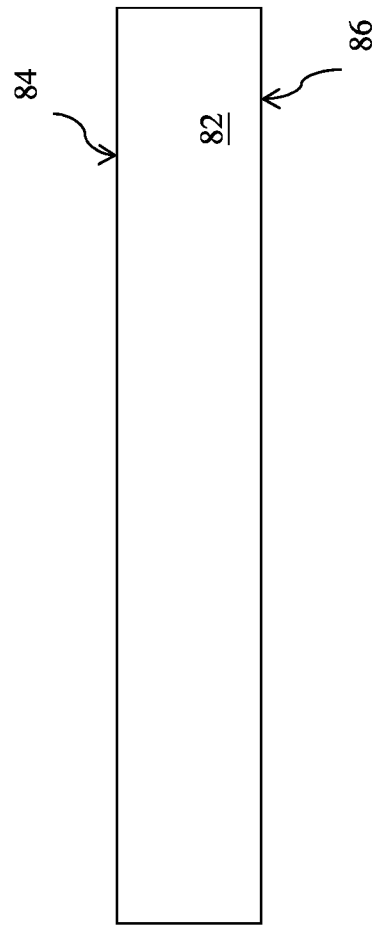
FIGS. 2 through 5 are sectional views of a semiconductor substrate, constructed according to various aspects of the present disclosure in one or more embodiments.

Referring to FIGS. 1 and 2, the method 50 includes providing a semiconductor substrate 82. The semiconductor substrate 82 includes silicon, such as a silicon wafer. Alternatively, the substrate includes germanium, silicon germanium or other proper semiconductor materials. In one embodiment, the semiconductor substrate 82 includes an epitaxy (or epi) semiconductor layer. In another embodiment, the semiconductor substrate 82 includes a buried dielectric material layer for isolation formed by a proper technology, such as a technology referred to as separation by implanted oxygen (SIMOX). In some embodiments, the substrate 82 may be a semiconductor on insulator, such as silicon on insulator (SOI).

The semiconductor substrate 82 has a front surface 84 and a backside surface 86 on opposing sides. Various integrated circuit (IC) features are formed or to be formed at later fabrication stages on the front surface 84 of the semiconductor substrate 82. In some embodiments, the semiconductor wafer 80 includes various doped features, such as n-wells and p-wells formed on the front surface 84 of the semiconductor substrate 82. In another embodiment, the semiconductor wafer 80 includes various IC active devices, such as transistors or diodes, formed on the front surface of the semiconductor substrate 82. In another embodiment, the semiconductor wafer 80 includes various IC passive devices, such as resistors, fuse features or capacitors, formed on the front surface of the semiconductor substrate 82.

In accordance with various embodiments, the semiconductor wafer 80 includes various isolation features, such as shallow trench isolation (STI) features, formed on the front surface of the semiconductor substrate 82. The isolation features are designed and configured to separate various devices and to provide isolation to the devices from each other. In one embodiment, the formation of the STI features includes, forming a hard mask with openings that define the regions for STI features; etching the semiconductor substrate through the openings of the hard mask to form trenches; depositing dielectric material to fill in the trenches; and performing a chemical mechanical polishing (CMP) process.

In accordance with various embodiments, the semiconductor wafer 80 further includes an interconnect structure or a portion thereof formed on the front surface 84 of the semiconductor substrate 82. The interconnect structure is designed and configured to couple various devices to form one or more functional circuits. The interconnect structure includes metal lines, via features and contact features.

Figure 3:
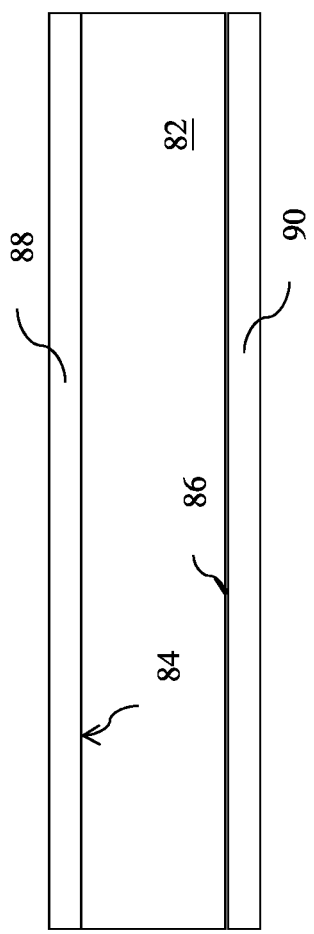

Referring to FIGS. 1 and 3, the method 50 includes an operation 54 to form polycrystalline silicon on the front surface and backside surface of the semiconductor substrate 82. Thus, a first polycrystalline silicon layer 88 and a second polycrystalline silicon layer 90 are formed on the front surface 84 and the backside surface 86 of the semiconductor substrate 82, respectively. In one embodiment, the thickness of the polycrystalline silicon layers 88 and 90 ranges between about 5 nm and about 20 nm.

The formation of the polycrystalline silicon layers may be executed in a reaction chamber, such as a furnace, with a deposition temperature tuned to have proper polycrystalline structure and grain sizes. In some embodiments, the deposition temperature ranges between about 500 C and about 660 C. In some embodiments, the deposition temperature is tuned between about 520 C and about 550 C, such that the formed silicon layers 88 and 90 further include amorphous silicon as a mixture of the amorphous silicon and polycrystalline silicon. This is also referred to as amorphous polycrystalline silicon. In some embodiments, the deposition temperature is tuned between about 560 C and about 650 C, such that the formed silicon layers 88 and 90 include polycrystalline silicon with proper grain sizes. For example, the average grain size ranges between about 15 angstrom and about 40 angstrom.

In one embodiment, the polycrystalline silicon layers 88 and 90 are formed using a precursor that includes silane (SiH4). In one example, the gas pressure in the reaction furnace ranges between about 0.5 torr and about 1 torr. In another example, the deposition duration ranges between about 2 hours and about 3 hours.

Figure 4:
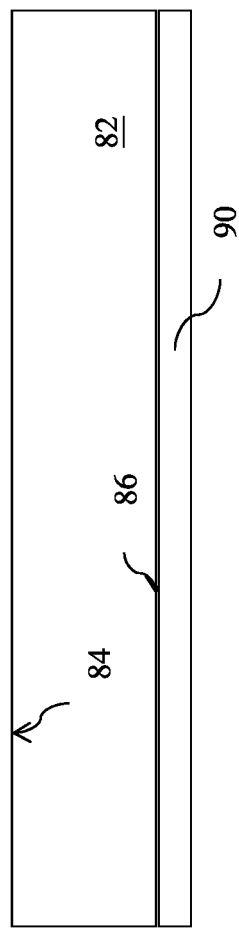

Referring to FIGS. 1 and 4, the method 50 includes operation 56 by selectively removing the first polycrystalline silicon layer 88 from the front surface 84 of the semiconductor substrate 82 using a suitable etch process. In some embodiments, the operation 56 includes a wet etch process using an etchant that includes ammonia. In one example, the etchant of ammonia has a concentration of 1:5, meaning the etchant includes 1 unit volume ammonia and 5 unit volume solvent. In some embodiments, the operation 56 includes a dry etch process using an etchant selected form the group consisting of SF6, CH2F2, CF4, Cl2, HBr or combinations thereof. In some embodiments, the operation 56 further includes another etch step to remove native silicon oxide using hydrofluoric acid (HF) formed on the first polycrystalline silicon layer 84 before applying the etch process to remove the first polycrystalline layer 88. After the operation 56, the first polycrystalline silicon layer 88 is removed but the second polycrystalline silicon layer 90 remains on the backside surface of the semiconductor substrate 82.

Figure 5:
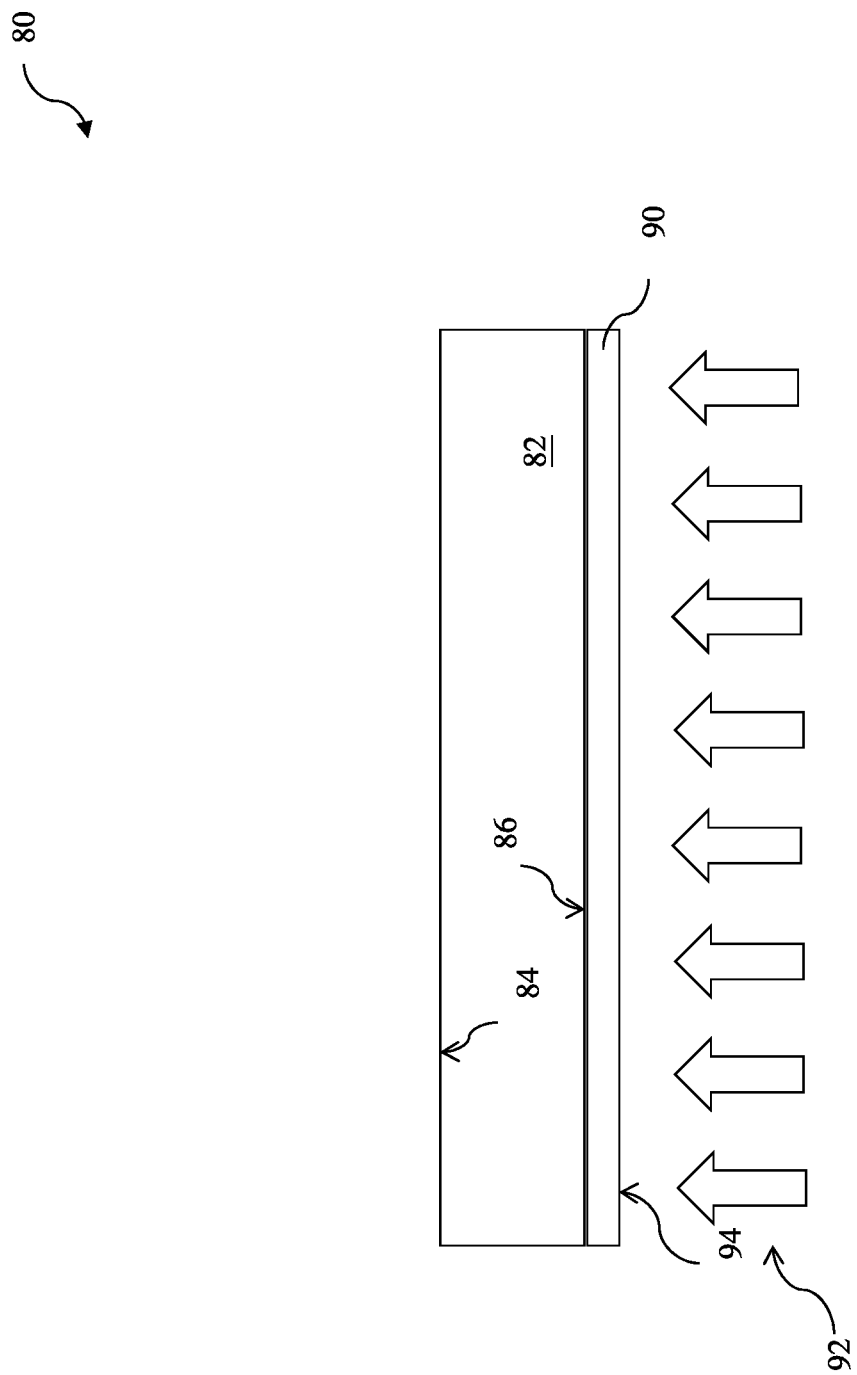
Figure 6:
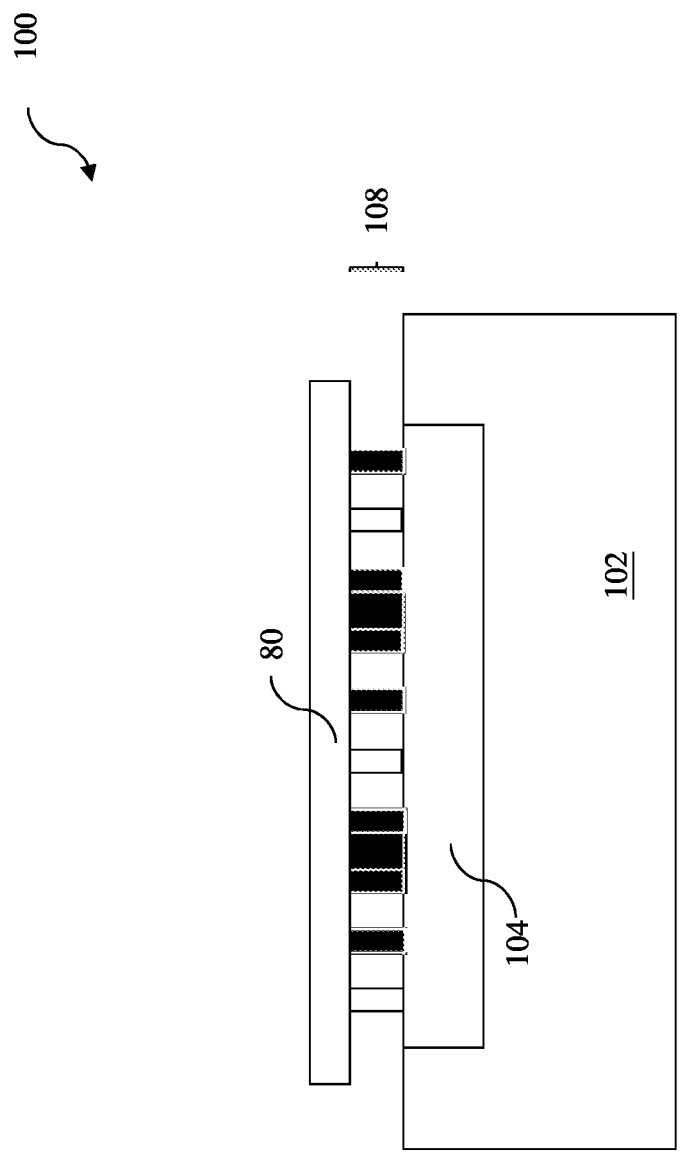
FIG. 6 is a schematic view of an integrated circuit fabrication system, in portion, constructed according to various aspects of the present disclosure in one embodiment.

Referring to FIGS. 1 and 5, the method 50 includes operation 58 by performing an ion implantation process 92 on the second polycrystalline silicon layer 90. The ion implantation is a post treatment performed on the second polycrystalline silicon layer 90 to enhance the roughness of the second polycrystalline silicon layer 90. The ion implantation in the operation 58 introduces a dopant into the second polycrystalline silicon layer 90. In some embodiments, the dopant is selected from the phosphorous, boron, nitrogen or combinations thereof. In some embodiments, the ion implantation process includes ion energy tuned to be greater than about 2 KeV. For one example, the ion energy ranges between 2 KeV and about 10 KeV. In another embodiment, the ion implantation process has an implantation dose tuned in a range between about $3 \times 10^{14}$ and about $6 \times 10^{16}$ atom/cm$^2$. After the ion implantation, the exposed surface 94 of the second polycrystalline silicon layer 90 has a surface roughness ranging between about 7 angstrom and about 20 angstrom according to one embodiment.

Thus prepared semiconductor substrate has a rough surface 94 on the backside of the semiconductor substrate 82 that can effectively reduce the clamping effect when being secured on an electrostatic chuck (E-chuck) during a lithography process, which will be explained further below in an exemplary lithography process for illustration.

Referring to FIGS. 1 and 6, the method 50 may further include a lithography process utilizing a lithography system. The lithography process is designed to form a patterned photoresist layer (or resist layer) and may include multiple steps, such as photoresist coating, soft baking, exposing, post-exposure baking (PEB), developing, and hard baking according to one example.

In the present embodiment, the method 50 includes an operation 62 by coating the semiconductor wafer 80 with a photoresist layer. Particularly, the photoresist layer is coated on the front surface 84 of the semiconductor substrate 82. In one example, the photoresist layer is formed on the semiconductor wafer 80 by a spin-on coating.

The photoresist layer includes a material designed to resist fabrication processes (such as etch and/or ion implantation) and is sensitive to a radiation energy used in the lithography exposure process. In the present embodiment, the photoresist layer is sensitive to an extreme ultraviolet (EUV) electromagnetic beam. The photoresist layer includes a matrix material resistant to etch or implantation. The photoresist layer also includes an EUV-sensitive component dispersed in the matrix material. The photoresist layer may further include a solvent mixed with the matrix material and the sensitive component. In various embodiments, the photoresist layer includes a positive tone resist or a negative tone resist.

After the photoresist layer is coated on the semiconductor substrate 82, other step may be further implemented. For example, a baking process may be applied to the photoresist layer to partially drive out the solvent from the photoresist layer. The coating of the photoresist layer at operation 62 may be implemented in a cluster tool (referred to as a track) designed to perform various lithography processes that include coating, baking and developing.

The method 50 also includes an operation 64 of securing the semiconductor wafer 80 on an electrostatic chuck 100 from the backside of the substrate 82. After the coating of the photoresist layer, the semiconductor wafer 80 is transferred to the lithography system for performing a lithography exposure process on the photoresist layer coated on the front surface 84 of the semiconductor substrate 82. In the present embodiment, the lithography system is an EUV lithography exposure system designed to expose the photoresist layer using an EUV beam. The lithography system includes an EUV source, optical module, a mask stage configured to secure a photomask (or mask) and a wafer stage to secure a wafer to be exposed. Especially, as various materials have high absorption to EUV energy, the optical elements and the mask are designed to be reflective, such as a curved mirror. Furthermore, the lithography exposure takes place in a vacuum to reduce absorption.

Particularly, the wafer stage utilizes the E-chuck 100 in the vacuum to secure the semiconductor wafer 80 from the backside. The photoresist layer coated on the front surface 84 of the semiconductor substrate 82 is facing away from the E-chuck 100, and the polycrystalline silicon layer 90 on the backside is facing the E-chuck 100.

FIG. 6 is a cross-sectional view of the E-chuck 100 with a wafer, such as the semiconductor wafer 80, mounted thereon. According to certain illustrative examples, the E-chuck 100 includes a substrate 102 and a charge plate 104 built in the chuck substrate 102 and operable to be charged for applying static electrical force to the wafer 80. The E-chuck further includes a number of support pins 108 designed to support the wafer 80 and leave a space between the wafer 80 and the E-chuck substrate 102 (and the charge plate 104 as well) such that a gas is able to flow through to reduce the clamping effect. Especially, the polycrystalline silicon layer 90 on the backside of the semiconductor substrate 82 is directly in contact with the support pins 108. In some embodiments, each of the support pins 108 has a height ranging between about 5 microns and about 15 microns and has a diameter ranging between about 0.2 mm and about 0.4 mm.

The E-chuck 100 further includes a mechanism to provide a gas flow through the space between the wafer 80 and the E-chuck substrate 102. For example, various gas openings are formed in the E-chuck substrate 102 to provide a gas flow with corresponding gas pressure to reduce the clamping effect on the wafer 80 from the static electronic force. The lithography system further includes a number of exhaust openings and a gas pumping mechanism. The chuck 100, having the wafer 80 secured thereon, is placed within a vacuum chamber during an EUV lithography exposure process.

As the polycrystalline silicon layer 90 is formed on the backside of the wafer 80 and has a rough surface 94, therefore, spacing is left between the contact between the support pins 108 and the polycrystalline silicon layer 90 due to the surface roughness. The gas is able to flow through the spacing between the support pins 108 and the polycrystalline silicon layer 90 to further reduce the local stress caused by the static electronic force on the wafer in the regions contacting the support pins 108. Thus, the clamping effect by the E-chuck 100 is eliminated or substantially reduced with the gas pressure and the rough surface of the wafer on the backside.

The method 50 further includes an operation 66 to flow a gas through the space between the wafer 80 and the E-chuck 100 and additionally through the spacing between the support pins 108 and the polycrystalline silicon layer 90. The operation 66 is executed using the gas pumping mechanism, gas openings and the exhaust openings. In one embodiment, the gas flow and accordingly the gas pressure are tuned to minimize the clamping effect.

The method 50 further includes an operation 68 to expose the photoresist layer coated on the wafer 80 using an EUV beam. A photomask is secured on the mask stage to provide an IC pattern to be imaged on the photoresist layer. An EUV beam from the EUV source carrying the image of the IC pattern defined on the photomask is projected on and exposes the photoresist layer, forming a latent pattern of the IC pattern on the photoresist layer.

Other processes may be implemented before, during and after the method 50. For example, the semiconductor wafer 80 is transferred out from the lithography system after the lithography exposure process and the photoresist layer is developed using a developing solution to form a patterned photoresist layer. In another example, various baking processes may be implemented. A PEB process may be applied to the exposed photoresist layer before the developing process. A hard baking process may be applied to the developed photoresist layer after the developing process. In some embodiments, an etch process may be applied to the semiconductor wafer 80 using the patterned photoresist layer as an etch mask. In some embodiments, an ion implantation process may be applied to the semiconductor wafer 80 using the patterned photoresist layer as an ion implantation mask. In some embodiments, various IC features are formed after the formation of the polycrystalline silicon layer 90. For example, various IC doped features are formed by ion implantation using the patterned photoresist layer as an ion implantation mask while the polycrystalline silicon layer 90 on the backside of the wafer 80 is utilized to reduce the clamping effect during the lithography EUV exposure process.

The present disclosure can be used in various applications where an E-chuck is used to secure a wafer and the E-chuck is in a vacuum. For example, when a dry etch process is implemented in a vacuum or a low pressure chamber with an E-chuck to secure the wafer, the polycrystalline silicon layer can be thus formed on the backside of the wafer to reduce the clamping effect during the dry etch process. In various embodiments, the method 50 may be used to form various IC circuits, such as logic circuits, analog circuits, imaging sensors, memory devices, and light-emitting diodes. The IC devices formed on the wafer 80 may include field effect transistors, static random access memory (SRAM), dynamic random access memory (DRAM), flash memory, or photodiodes.

Thus, the present disclosure provides a semiconductor structure. The semiconductor structure includes a semiconductor substrate having a front surface and a backside surface; integrated circuit features formed on the front surface of the semiconductor substrate; and a polycrystalline silicon layer disposed on the backside surface of the semiconductor substrate.

In accordance with various embodiments, the polycrystalline silicon layer has a surface roughness ranging between about 7 angstrom and about 20 angstrom.

In another embodiment, the polycrystalline silicon layer further includes a minority dopant selected from the group consisting of phosphorous, boron, nitrogen and combinations thereof.

In yet another embodiment, the minority dopant in the polycrystalline silicon layer has a concentration ranging between $3 \times 10^{14}/cm^3$ and $6 \times 10^{20}/cm^3$.

In yet another embodiment, the polycrystalline silicon layer includes polycrystalline silicon grains with grain size ranging between about 15 angstrom and about 40 angstrom.

In yet another embodiment, the integrated circuit features include doped well, shallow trench isolation features, field effect transistor, photodiode, or combinations thereof.

The present disclosure also provides a embodiment of a method for making an integrated circuit. The method includes providing a semiconductor substrate having a front surface and a backside surface opposing to the front surface; forming a first polycrystalline silicon layer and a second polycrystalline silicon layer on the front surface and the backside surface of the semiconductor substrate, respectively; removing the first polycrystalline silicon layer from the front surface of the semiconductor substrate; and implanting the second polycrystalline silicon layer on the backside surface of the semiconductor substrate.

In one embodiment of the method, the implanting the second polycrystalline silicon layer generates the second polycrystalline silicon layer with a surface roughness ranging between about 7 angstrom and about 20 angstrom.

In another embodiment, the implanting the second polycrystalline silicon layer includes implanting with a dopant selected from the group consisting of phosphorous, boron, nitrogen and a combination thereof.

In yet another embodiment, the forming a first polycrystalline silicon layer and a second polycrystalline silicon layer includes using a precursor including silane (SiH4).

In yet another embodiment, the forming a first polycrystalline silicon layer and a second polycrystalline silicon layer includes forming a first polycrystalline silicon layer and a second polycrystalline silicon layer with a deposition temperature ranging between about 500 C and about 660 C.

In yet another embodiment, the forming a first polycrystalline silicon layer and a second polycrystalline silicon layer includes forming a first polycrystalline silicon layer and a second polycrystalline silicon layer with a deposition temperature ranging between about 520 C and about 550 C.

In yet another embodiment, the forming a first polycrystalline silicon layer and a second polycrystalline silicon layer includes forming a first polycrystalline silicon layer and a second polycrystalline silicon layer in a furnace with a deposition temperature ranging between about 560 C and about 650 C.

In yet another embodiment, the forming a first polycrystalline silicon layer and a second polycrystalline silicon layer includes providing silane with a pressure ranging between about 0.5 torr and about 1 torr.

In yet another embodiment, the removing the first polycrystalline silicon layer includes applying a wet etchant that includes ammonia.

In yet another embodiment, the removing the first polycrystalline silicon layer includes applying a dry etchant that includes SF6, CH2F2, CF4, Cl12, HBr, or combination thereof.

In yet another embodiment, the method further includes positioning the semiconductor substrate on an electrostatic chuck such that the second polycrystalline silicon layer is facing the electrostatic chuck and the semiconductor substrate is secured by the electrostatic chuck.

In yet another embodiment, the method further includes coating the semiconductor substrate with a photoresist layer on the front surface of the semiconductor substrate before the positioning the semiconductor substrate on an electrostatic chuck; and exposing the photoresist layer using an Extreme Ultra-Violet (EUV) beam after the positioning the semiconductor substrate on an electrostatic chuck.

In yet another embodiment, the method further includes pumping a gas through a number of gas openings within the electrostatic chuck.

The present disclosure also provides another embodiment of a method that includes providing a semiconductor wafer having a front surface and a backside surface; forming a polycrystalline silicon layer on the backside surface of the semiconductor wafer; coating the front surface of the semiconductor wafer with a photoresist layer; securing the semiconductor wafer on an electrostatic chuck of an Extreme Ultra-Violet (EUV) lithography system such that the polycrystalline silicon layer is facing the electrostatic chuck; and exposing the photoresist layer by the Extreme Ultra-Violet (EUV) lithography system.

In one embodiment of the method, the providing a semiconductor wafer having a front surface and a backside surface includes forming polycrystalline silicon on the front surface and the backside surface of the semiconductor wafer; removing the polycrystalline silicon from the front surface of the semiconductor wafer; and implanting the polycrystalline silicon layer formed on the backside surface of the semiconductor wafer.

The foregoing has outlined features of several embodiments. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions and alterations herein without departing from the spirit and scope of the present disclosure.

What is claimed is:

1. A semiconductor structure, comprising:
   a semiconductor substrate having a front surface and a backside surface;
   integrated circuit features formed on the front surface of the semiconductor substrate; and
   a polycrystalline silicon layer disposed on the backside surface of the semiconductor substrate, a surface of the polycrystalline silicon layer having a surface roughness sufficient to allow gas flow between the surface of the polycrystalline silicon layer and a contacting support pin.

2. The semiconductor structure of claim 1, wherein the surface roughness ranges between about 7 angstrom and about 20 angstrom.

3. The semiconductor structure of claim 1, wherein the polycrystalline silicon layer further includes a minority dopant selected from a group consisting of phosphorous, boron, nitrogen, and combinations thereof.

4. The semiconductor structure of claim 3, wherein the minority dopant in the polycrystalline silicon layer has a concentration ranging between $3 \times 10^{14}/cm^3$ and $6 \times 10^{20}/cm^3$.

5. The semiconductor structure of claim 1, wherein the polycrystalline silicon layer includes polycrystalline silicon grains with grain size ranging between about 15 angstrom and about 40 angstrom.

6. The semiconductor structure of claim 1, wherein a thickness of the polycrystalline silicon layer ranges between about 5 nm and about 20 nm.

7. A semiconductor structure, comprising:
   a semiconductor substrate having a front surface and a backside surface;
   a polycrystalline silicon layer disposed on the backside surface of the semiconductor substrate, the polycrystalline silicon layer comprising a rough surface, the rough surface having a surface roughness sufficient to allow gas flow between the surface of the polycrystalline silicon layer and a contacting support pin.

8. The semiconductor structure of claim 7, wherein the surface roughness ranges between about 7 angstrom and about 20 angstrom.

9. The semiconductor structure of claim 7, wherein the polycrystalline silicon layer further includes a minority dopant selected from a group consisting of phosphorous, boron, nitrogen, and combinations thereof.

10. The semiconductor structure of claim 9, wherein the minority dopant in the polycrystalline silicon layer has a concentration ranging between $3\times10^{14}/cm^3$ and $6\times10^{20}/cm^3$.

11. The semiconductor structure of claim 7, wherein the polycrystalline silicon layer includes polycrystalline silicon grains with grain size ranging between about 15 angstrom and about 40 angstrom.

12. The semiconductor structure of claim 7, wherein a thickness of the polycrystalline silicon layer ranges between about 5 nm and about 20 nm.

13. The semiconductor structure of claim 7, further comprising integrated circuit features formed on the front surface of the semiconductor substrate.

14. A semiconductor structure, comprising:
a semiconductor substrate having a front surface and a backside surface;
integrated circuit features formed on the front surface of the semiconductor substrate,
a polycrystalline silicon layer disposed on the backside surface of the semiconductor substrate, the polycrystalline silicon layer comprising a rough surface, the rough surface having a surface roughness sufficient to allow gas flow between the surface of the polycrystalline silicon layer and a contacting support pin.

15. The semiconductor structure of claim 14, wherein a thickness of the polycrystalline silicon layer ranges between about 5 nm and about 20 nm.

16. The semiconductor structure of claim 14, wherein the surface roughness ranges between about 7 angstrom and about 20 angstrom.

17. The semiconductor structure of claim 14, wherein the polycrystalline silicon layer further includes a minority dopant selected from a group consisting of phosphorous, boron, nitrogen, and combinations thereof.

18. The semiconductor structure of claim 17, wherein the minority dopant in the polycrystalline silicon layer has a concentration ranging between $3\times10^{14}/cm^3$ and $6\times10^{20}/cm^3$.

19. The semiconductor structure of claim 14, wherein the polycrystalline silicon layer includes polycrystalline silicon grains with grain size ranging between about 15 angstrom and about 40 angstrom.

20. The semiconductor structure of claim 14, further comprising integrated circuit features formed on the front surface of the semiconductor substrate.

* * * * *